United States Patent [19]
Whitten

[11] Patent Number: 5,412,261
[45] Date of Patent: May 2, 1995

[54] TWO-STAGE PROGRAMMABLE INTERCONNECT ARCHITECTURE

[75] Inventor: Ralph G. Whitten, San Jose, Calif.

[73] Assignee: Aptix Corporation, San Jose, Calif.

[21] Appl. No.: 870,004

[22] Filed: Apr. 14, 1992

[51] Int. Cl.⁶ .................... H03K 19/173; H01L 25/00
[52] U.S. Cl. ........................................ 326/41; 326/39
[58] Field of Search .............................. 307/465, 465.1

[56] References Cited

U.S. PATENT DOCUMENTS

| | | | |
|---|---|---|---|
| 4,992,680 | 2/1991 | Benedetti et al. | 307/465 |
| 5,015,885 | 5/1991 | El Gamal et al. | 307/465 |
| 5,023,606 | 6/1991 | Kaplinsky | 307/465 |
| 5,132,571 | 7/1992 | McCollum et al. | 307/465.1 |
| 5,144,166 | 9/1992 | Camarota et al. | 307/465.1 |
| 5,166,557 | 11/1992 | Chen et al. | 307/465.1 |
| 5,212,652 | 5/1993 | Agrawal et al. | 307/465 |
| 5,233,539 | 8/1993 | Agrawal et al. | 307/465 |
| 5,243,226 | 9/1993 | Chan | 307/465 |

Primary Examiner—Edward P. Westin
Assistant Examiner—Richard Roseen
Attorney, Agent, or Firm—D'Alessandro, Frazzini & Ritchie

[57] ABSTRACT

An interconnection matrix configured according to the present invention includes a plurality of conductors disposed on a substrate which may contain an integrated circuit. A first group of the conductors are directly connected to I/O pins provided on the substrate. A second group of the conductors are internal to the substrate. A plurality of programmable elements are disposed on the substrate and are connected between selected ones of the first and second groups of conductors. By selectively programming the antifuse elements, a user may configure the conductors into a custom interconnect pattern. Means are provided to place each conductor in the second group of internal segmented conductors at a selected voltage during programming of the interconnect architecture of the present invention. The antifuses in a selected circuit path between two I/O pads are all initially programmed at an appropriate programming voltage utilizing a low current. After all antifuses in the selected circuit path have been initially programmed, a high programming current is passed through the circuit path between the I/O pads at its ends to complete the programming cycle.

34 Claims, 5 Drawing Sheets

TWO-STAGE PROGRAMMABLE INTERCONNECT ARCHITECTURE

BACKGROUND OF THE INVENTION

1. Filed of the Invention

The present invention relates to integrated circuit technology and to user-configurable circuits. More particularly, the present invention relates to an architecture employing user-programmable interconnect elements.

2. The Prior Art

Antifuses have been used for a variety of programmable products, including gate arrays, PROMs, and programmable silicon circuit boards. Antifuses are usually programmed by placing a high voltage across the antifuse and forcing a current through the antifuse. Programmed antifuses have the characteristic that the final resistance after programming is inversely proportional to the programming current. Generally, a higher programming current produces an antifuse having a lower final resistance. It is usually desirable to obtain the lowest practicable resistance in a programmed antifuse.

The necessity of applying both high voltage and high current to the antifuse complicates the programming circuitry and devices, limits the number of programmable elements which can be implemented, and adds considerable expense to the final product. In some cases, particularly in products which require low final antifuse resistance, programming devices become overly complicated, costly, and result in lower device yield.

A particular problem arises when the interconnection architecture includes significant numbers of internally-located programmable elements (i.e., programmable elements which are not directly connected to conductors which terminate in input/output pins of the device). Providing for access to the internally-located programmable elements during the programming process is often problematic, especially where large numbers of internally-located programmable elements are encountered. This problem is not limited to programmable interconnect architectures employing antifuse elements.

It is an object of the present invention to provide an interconnection architecture which overcomes some of the limitations of programming circuitry and devices.

It is another object of the present invention to provide an interconnection architecture in which programmable elements, including antifuses, located at internal circuit nodes may be initially programmed without the use of relatively high programming currents.

Another object of the present invention is to provide a method for programming the programmable elements in a user-programmable interconnection architecture which avoids some of the shortcomings of prior art programming processes, such as access to internal programmable elements and provision of high programming current to already-programmed antifuses to achieve minimal final resistance.

BRIEF DESCRIPTION OF THE INVENTION

According to a first aspect of the present invention, an interconnection matrix includes a plurality of conductors disposed on a substrate which may contain an integrated circuit or which may be an insulative substrate or a conductive substrate covered by an insulating layer. A first group of the conductors are directly connected to input/output pins provided on the substrate. A second group of the conductors are internal to the substrate and are not directly accessibly from any input/output pin.

A plurality of user-programmable elements, preferably antifuse elements, are disposed on the substrate and are connected between selected ones of the first and second groups of conductors. By selectively programming the user-programmable elements, an end-user may configure the conductors into a custom interconnect pattern.

Means are provided to place each conductor in the second group of internal segmented conductors at a selected voltage, or to supply a selected current to a selected internal segmented conductor during programming of the interconnect architecture of the present invention. According to a first aspect of the present invention, semiconductor switches, such as MOS transistors, are connected between selected voltage sources and the internal conductors and, when activated, individually bias the internal conductors to desired voltages to program the user-programmable elements. According to a second aspect of the present invention, the internal conductors connected to programming pins interspersed with the input/output pins in a pin-grid array.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, an architecture and programming method provide for programming of antifuse elements utilizing a high voltage and low current to initiate the breakdown of the insulating layer located between the antifuse electrodes, and subsequently utilizing a higher current at a lower voltage to reduce the final resistance of the programmed antifuse to a desired level. The high current may be applied through a number of external user pins which are supplied with a low voltage and high current. This scheme, when applied to a plurality of antifuses in series, allows all internal segments of an interconnection matrix to be initially programmed with a low current only, thus eliminating the need to employ on chip high current drivers for the internal segments. This allows the internal segments to be driven by small transistors with low current driver capability to provide the initial insulation breakdown phase of programming.

Figure 1:
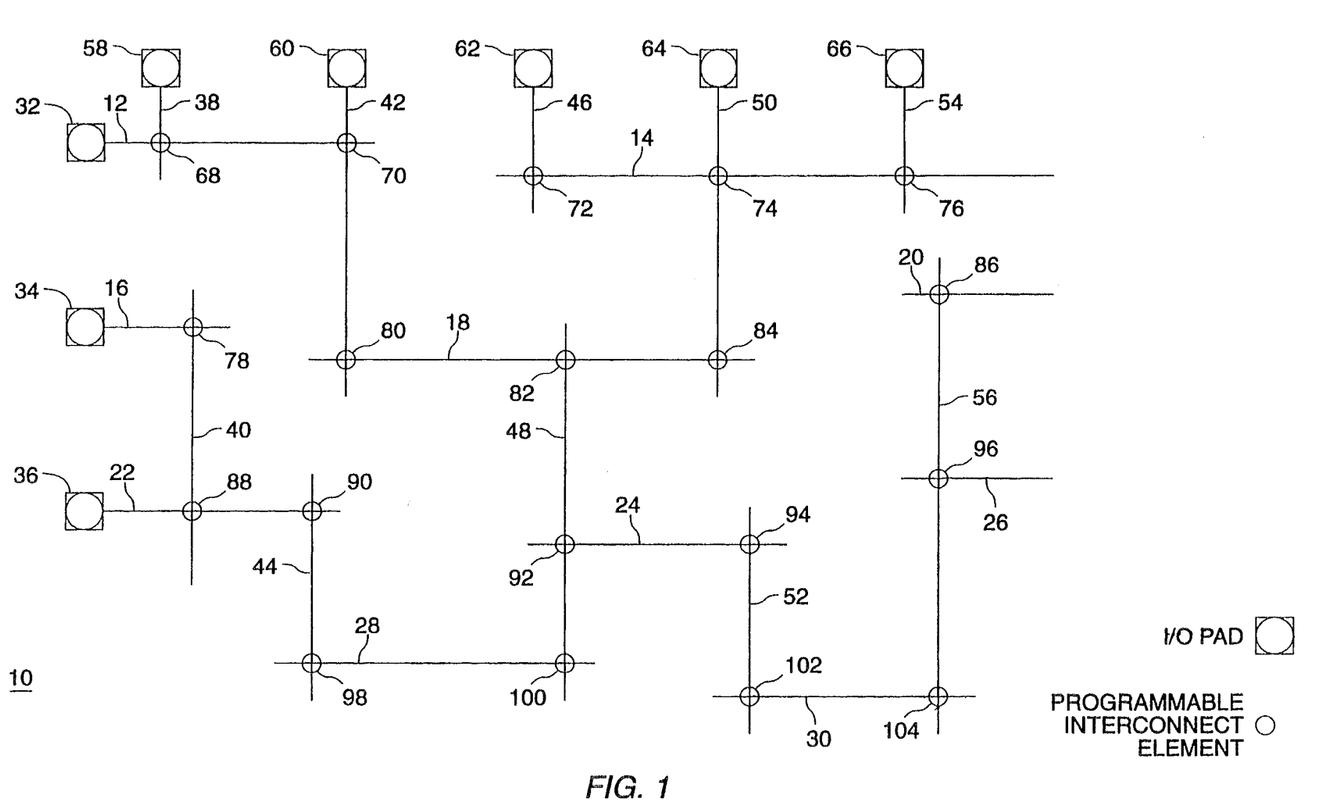
FIG. 1 is a schematic diagram of an illustrative programmable interconnect matrix employing user-programmable antifuse elements which may be utilized according to the present invention.

Referring first to FIG. 1, a schematic diagram of a portion of a crosspoint switch or interconnect matrix (hereinafter referred to as interconnection matrix 10) is shown. Interconnection matrix 10 may be integrated on one of a number of different kinds of substrates, as is well known in the art. For purposes of simplicity herein, the entire structure will be referred to as an integrated circuit regardless of the conductive nature of the substrate or the nature of any active circuitry, if any, located on the substrate. Those of ordinary skill in the art will recognize that other types of devices, such as multichip modules, hybrids, displays, etc., are included within the scope of this invention.

Interconnection matrix 10 includes a plurality of conductors running in a first direction, shown as horizontal conductors 12, 14, 16, 18, 20, 22, 24, 26, 28, and 30 in FIG. 1. A first group of the horizontal conductors, comprising conductors 12, 16, and 22, are connected to input/output (I/O) pads 32, 34, and 36 provided for connecting outside signals to the interconnect matrix. A second group of the horizontal conductors, comprising conductors 14, 18, 20, 24, 26, 28, and 30 are internal to the integrated circuit and have no direct connection to I/O pads.

Interconnection matrix 10 also includes a plurality of conductors running in a second direction, shown as vertical conductors 38, 40, 42, 44, 46, 48, 50, 52, 54, and 56 in FIG. 1. A first group of the vertical conductors, comprising conductors 38, 42, 46, 50, and 54, are connected to I/O pads 58, 60, 62, 64, and 66 provided for connecting outside signals to the interconnection a matrix. A second group of the vertical conductors, comprising conductors 40, 44, 48, 52, and 56, are internal to the integrated circuit and have no direct connection to I/O pads.

The vertical conductors 38 through 56 form intersections with the horizontal conductors 12 through 30. User-programmable elements are located at selected ones of the intersections of vertical and horizontal conductors. These elements are preferably any one of a variety of antifuse type devices. These elements will be variously referred to herein as programmable interconnect elements or antifuses. In a preferred embodiment, the user-programmable interconnect elements are located at each intersection of a vertical and a horizontal conductor and are connected between the intersecting conductors. Thus, antifuses 68, 70, 72, 74, 76, 78, 80, 82, 84, 86, 88, 90, 92, 94, 96, 98, 100, 102, and 104 are shown in FIG. 1 as 18 circles located at the intersections of the horizontal and vertical conductors 12 through 30 and 38 through 56, respectively. Those of ordinary skill in the art will recognize that the present invention is described using antifuses as an example. Such persons will realize that the principles disclosed herein will apply to other programmable devices exhibiting similar programming mechanisms.

Numerous antifuse structures are known in the prior art and may be employed in the present invention. An illustrative antifuse element which may be employed in the present invention may comprise a layer of antifuse material, such as amorphous silicon, in contact with two electrodes which may comprise the two conductors. The antifuse material is disposed in an antifuse aperture formed at the intersection of the two conductors in an insulating layer separating the two conductors.

Prior to programming, the antifuses have a resistance of about 5 Gohms. During programming, after initial breakdown of the antifuse material separating the two antifuse electrodes, each antifuse has a high resistance of about 200 ohms or more. The antifuse resistance may be reduced to less than a few ohms by application of high current (i.e., in the range of about between 20 mA to 2 A or more) through the antifuse.

As can be seen by an examination of FIG. 1, programming of antifuses connected to internal conductors presents somewhat of a problem because some means must be provided to supply the necessary programming voltage to those antifuses. For example, if it is desired to connect I/O pad 36 to I/O pad 64 via conductors 22, 44, 28, 48, 18, and 50, some means must be provided for supplying programming voltage to internal conductors 44, 28, 48, and 18 to program antifuses 90, 98, 100, 82, and 84. To completely program these antifuses using prior art methods, the means used to supply the programming voltage must be capable of supplying the higher programming current necessary to reduce the antifuse resistance to its final value. In prior art interconnection architectures, transistors have been utilized to supply programming voltages to user-programmable antifuses located internally in an integrated circuit structure. If transistors are selected as the means to supply the programming voltage to internal conductors, they must be designed to be fairly large to handle the current required to reduce the programmable device to its lowest resistance value. To date, this resistance has limited the final resistance of antifuses to several hundred ohms or has limited the number of internal conductors. Use of such large transistors takes up significant amounts of substrate area and places a limit on the size of an interconnect matrix which can be practically realized in a real world fabrication environment.

According to the present invention, the antifuse elements in a completed circuit path between two I/O pads are all first initially programmed in a first programming phase. The purpose of the first programming phase is only to rupture the antifuse material between the two electrodes. Large values of current are not required to be supplied during the first programming phase because the rupture of antifuse material is a voltage sensitive phenomenon.

The present invention takes advantage of the fact that large amounts of current are not required for the first phase of antifuse programming. According to a first aspect of the present invention, a small sized MOS transistor, having voltage breakdown characteristics sufficient to withstand the application of programming voltage, is connected between each of the internal segments and a fixed voltage node. The MOS transistors may be connected as pullup devices or as pulldown devices.

Figure 2:
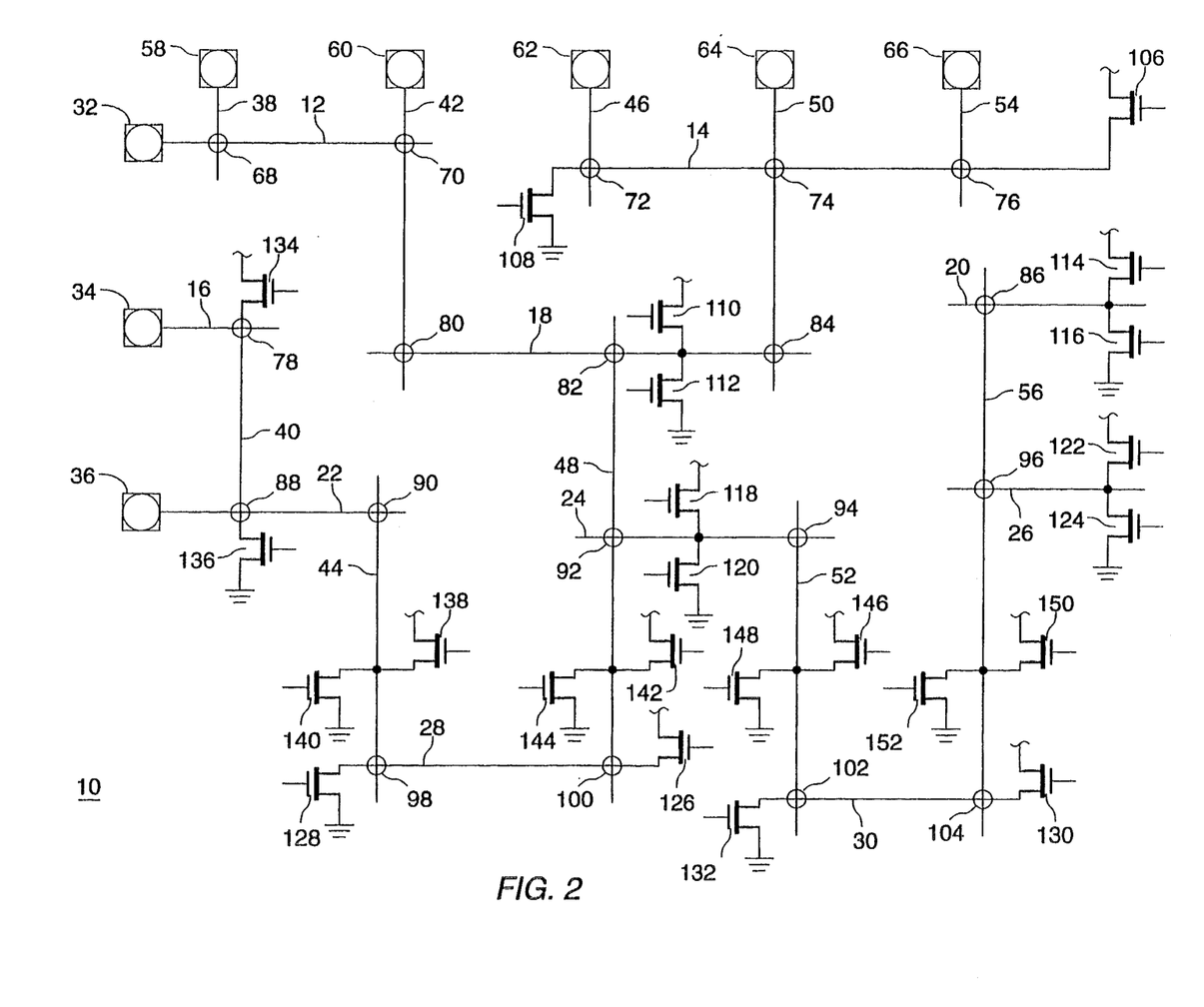
FIG. 2 is a schematic diagram of the programmable interconnect matrix of FIG. 1 incorporating integrated transistors for programming user-programmable antifuse elements connected to internal conductors according to a presently preferred embodiment of the invention.

Thus, referring now to FIG. 2, pullup transistor 106 is shown connected between horizontal internal conductor 14 and a high voltage node, and pulldown transistor 108 is shown connected between horizontal internal conductor 14 and ground. Pullup transistor 110 is shown connected between horizontal internal conductor 18 and a high voltage node, and pulldown transistor 112 is shown connected between horizontal internal conductor 18 and ground. Pullup transistor 114 is shown connected between horizontal internal conductor 20 and a high voltage node, and pulldown transistor 116 is shown connected between horizontal internal conductor 20 and ground. Pullup transistor 118 is shown connected between horizontal internal conductor 24 and a high voltage node, and pulldown transistor 120 is shown connected between horizontal internal conductor 24 and ground. Pullup transistor 122 is shown connected between horizontal internal conductor 26 and a high voltage node, and pulldown transistor 124 is shown connected between horizontal internal conductor 26 and ground. Pullup transistor 126 is shown connected between horizontal internal conductor 28 and a high voltage node, and pulldown transistor 128 is shown connected between horizontal internal conductor 28 and ground. Pullup transistor 130 is shown connected between horizontal internal conductor 30 and a high voltage node, and pulldown transistor 132 is shown connected between horizontal internal conductor 30 and ground.

Similarly, pullup transistor 134 is shown connected between vertical internal conductor 40 and a high voltage node, and pulldown transistor 136 is shown connected between vertical internal conductor 40 and ground. Pullup transistor 138 is shown connected between vertical internal conductor 44 and a high voltage node, and pulldown transistor 140 is shown connected between vertical internal conductor 44 and ground. Pullup transistor 142 is shown connected between vertical internal conductor 48 and a high voltage node, and pulldown transistor 144 is shown connected between vertical internal conductor 48 and ground. Pullup transistor 146 is shown connected between vertical internal conductor 52 and a high voltage node, and pulldown transistor 148 is shown connected between vertical internal conductor 52 and ground. Pullup transistor 150 is shown connected between vertical internal conductor 56 and a high voltage node, and pulldown transistor 152 is shown connected between vertical internal conductor 56 and ground.

The use of both pullup and pulldown transistors associated with each horizontal and vertical internal conductor in the interconnection matrix 10 of FIG. 2 is for the purposes of illustration of the principles of the present invention the use of both kinds of transistors is not necessary for each conductor. Those of ordinary skill in the art will realize that only a pullup or a pulldown transistor need be associated with each vertical and horizontal internal conductor as long as the correct polarity of voltage can be communicated to the other side of the antifuse selected for programming associated with that conductor. Those of ordinary skill in the art will recognize that various other circuits are also acceptable.

Because small pullup and pulldown transistors are utilized, they may be integrated onto the same semiconductor substrate as the programmable interconnection matrix 10. The transistors may be fabricated as single crystal silicon devices, in which case the programmable matrix may be fabricated on silicon substrates, or the transistors can be fabricated from thin-film devices, for example, amorphous silicon or polysilicon thin-film transistors, in which case the substrate upon which interconnection matrix 10 is disposed can be any type.

From an examination of FIG. 2 it can be seen how the complete circuit paths between I/O pads of programmable interconnection matrix 10 may be realized. Using the same example used earlier with reference to FIG. 1, it is assumed that it is desired to connect I/O pad 36 to I/O pad 64 via conductors 22, 44, 28, 48, 18, and 50. Antifuses 88, 90, 98, 100, 82, and 84 associated with internal conductors 44, 28, 48, and 18 must be programmed.

In accordance with the aspect of the present invention illustrated in FIG. 2, antifuse 90 may be programmed by placing a programming voltage $V_{PP}$ on I/O pad 36 and turning on pulldown transistor 140. Alternatively, I/O pad 36 could be grounded and pullup transistor 138 turned on. In either case, the programming voltage $V_{PP}$ will appear across antifuse 90.

Next, to program antifuse 98, either pullup transistor 138 and pulldown transistor 128 or pullup transistor 126 and pulldown transistor 140 are turned on to place $V_{PP}$ across antifuse 98. To program antifuse 100, either pullup transistor 126 and pulldown transistor 144 or pullup transistor 142 and pulldown transistor 128 are turned on to place $V_{PP}$ across antifuse 100. To program antifuse 82, either pullup transistor 110 and pulldown transistor 144 or pullup transistor 142 and pulldown transistor 112 are turned on to place $V_{PP}$ across antifuse 82. Finally, to program antifuse 84, either pulldown transistor 112 is turned on while applying $V_{PP}$ to I/O pad 64, or pullup transistor 110 is turned on while grounding to I/O pad 64 to place $V_{PP}$ across antifuse 84.

Those of ordinary skill in the art will recognize from FIG. 2 that the order in which the antifuses are programmed is flexible and that they need not be programmed in the order disclosed above.

According to this aspect of the present invention, after all antifuses in a circuit path between two I/O pads have been programmed, a second programming phase includes passing a high programming current through the completed circuit between the two I/O pads. The programming current is of sufficient magnitude to lower the resistance of each of the antifuses in the circuit to an acceptable final low value. In the example just given, after antifuses 90, 98, 100, 82, and 84 have been initially programmed by rupturing the antifuse material, a ramped current is passed between I/O pads 36 and 64. The purpose of ramping the current is to prevent high voltages internally which might inadvertently program antifuses while the programmed antifuses still exhibit a high impedance.

Those of ordinary skill in the art will note that, since I/O pads 36 and 64 are accessible to the outside of the integrated circuit, high current may be passed through them without the need for high current capacity internal active circuit components in the circuit path. Thus the pullup and pulldown transistors need only be designed to withstand $V_{PP}$ at a fraction of the current carrying capacity necessary to complete the programming of the antifuses to their final low resistance values.

FIG. 2 shows the gates of the pullup and pulldown transistors to be uncommitted. In order to reduce the pin count of a circuit including the interconnect circuitry of the present invention, the gates of the pullup and pulldown transistors may be driven from conventional decoding circuits. The design of such circuits is well within the level of ordinary skill in the art represented by the average circuit designer with several years of experience in designing MOS and CMOS integrated circuits and is beyond the scope of the present invention. Those of ordinary skill in the art will readily recognize that such decoding circuits which may be used with the present invention include, but are not limited to, n-bit binary to one line address decoders and serial shift register chains.

Those of ordinary skill in the art will also recognize that, where serial shift register chains are used to drive the gates of the pullup and pulldown transistors, programming speed can be increased by simultaneous initial programming of two or more antifuses in a single circuit path.

Referring again to the example given with reference to FIG. 2 for programming a connection between I/O pads 36 and 64 using the path as previously described, if $V_{PP}$ is placed on I/O pad 36, I/O pad 64 is grounded, and transistors 140, 126, 144, and 110 are turned on, antifuses 90, 98, 100, 82, and 84 will be simultaneously programmed. Similarly, if $V_{PP}$ is placed on I/O pad 64, I/O pad 36 is grounded, and transistors 138, 128, 142, and 112 are turned on, antifuses 90, 98, 100, 82, and 84 will also be simultaneously programmed.

Means other than individual pullup and pulldown transistors may be used to communicate voltages, such as ground and $V_{PP}$, to the internal conductors in an interconnection matrix like matrix 10 of FIGS. 1 and 2. From the description herein, those of ordinary skill in the art will readily realize that known circuits, such as multiplexers, which provide both the decoding and voltage steering functions, will function adequately in place of the pullup and pulldown transistors shown in FIG. 2. Two independently addressable multiplexers, one distributing $V_{PP}$ and one distributing ground, could be used to distribute programming voltages to internal conductors in an interconnection matrix 10 according to the present invention.

Figure 3:
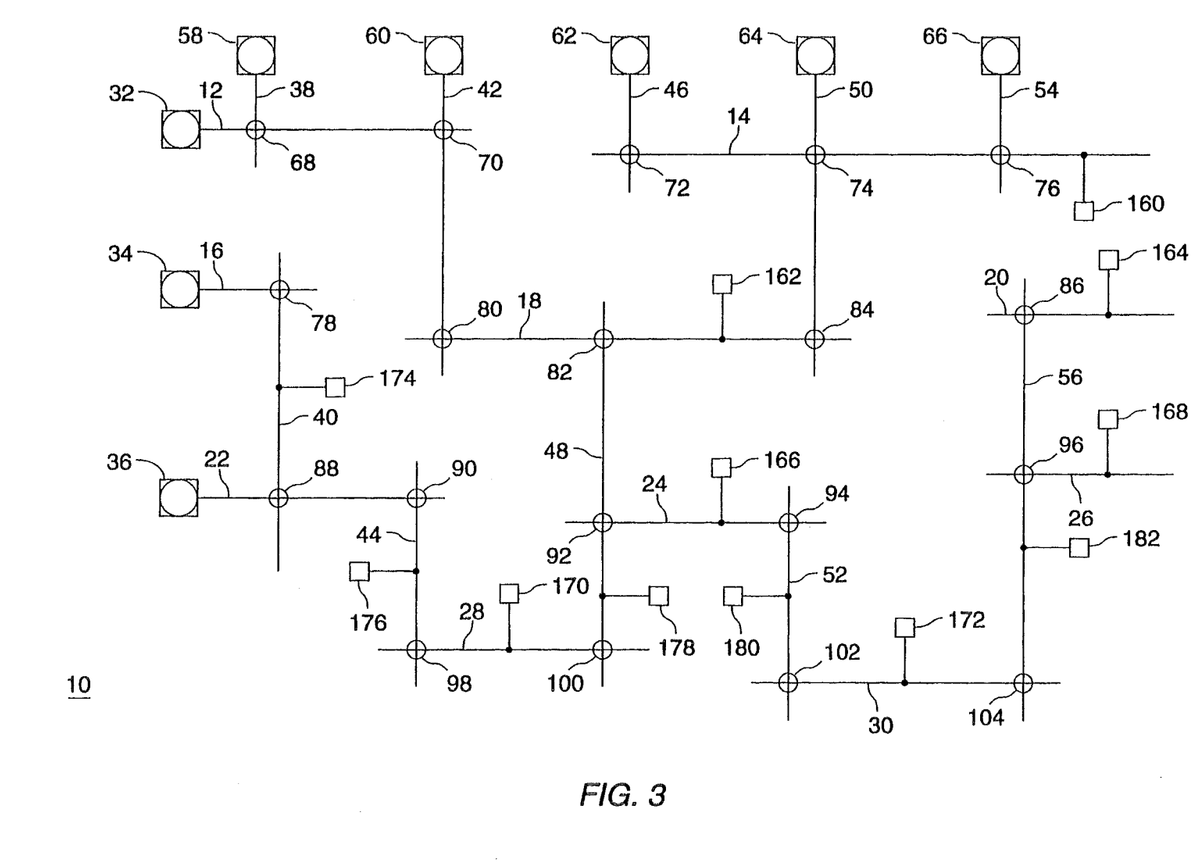
FIG. 3 is a schematic diagram of programmable interconnect matrix according to the present invention incorporating additional input/output pins to program user-programmable antifuse elements connected to internal conductors according to an alternate embodiment of the present invention.

Referring now to FIG. 3, an alternate embodiment of the present invention is shown in the context of the illustrative programmable interconnection matrix 10 of FIG. 1. As can be seen from an examination of FIG. 3, the internal segments 14, 18, 20, 24, 26, 28, 30, 40, 44, 48, 52, and 56 which are not directly connected to one of the I/O pads are connected instead to programming pads.

Thus, internal segment 14 is connected to programming pad 160, internal segment 18 is connected to programming pad 162, internal segment 20 is connected to programming pad 164, internal segment 24 is connected to programming pad 166, internal segment 26 is connected to programming pad 168, internal segment 28 is connected to programming pad 170, internal segment 30 is connected to programming pad 172, internal segment 40 is connected to programming pad 174, internal segment 44 is connected to programming pad 176, internal segment 48 is connected to programming pad 178, internal segment 52 is connected to programming pad 180, and internal segment 56 is connected to programming pad 182.

Figure 4:
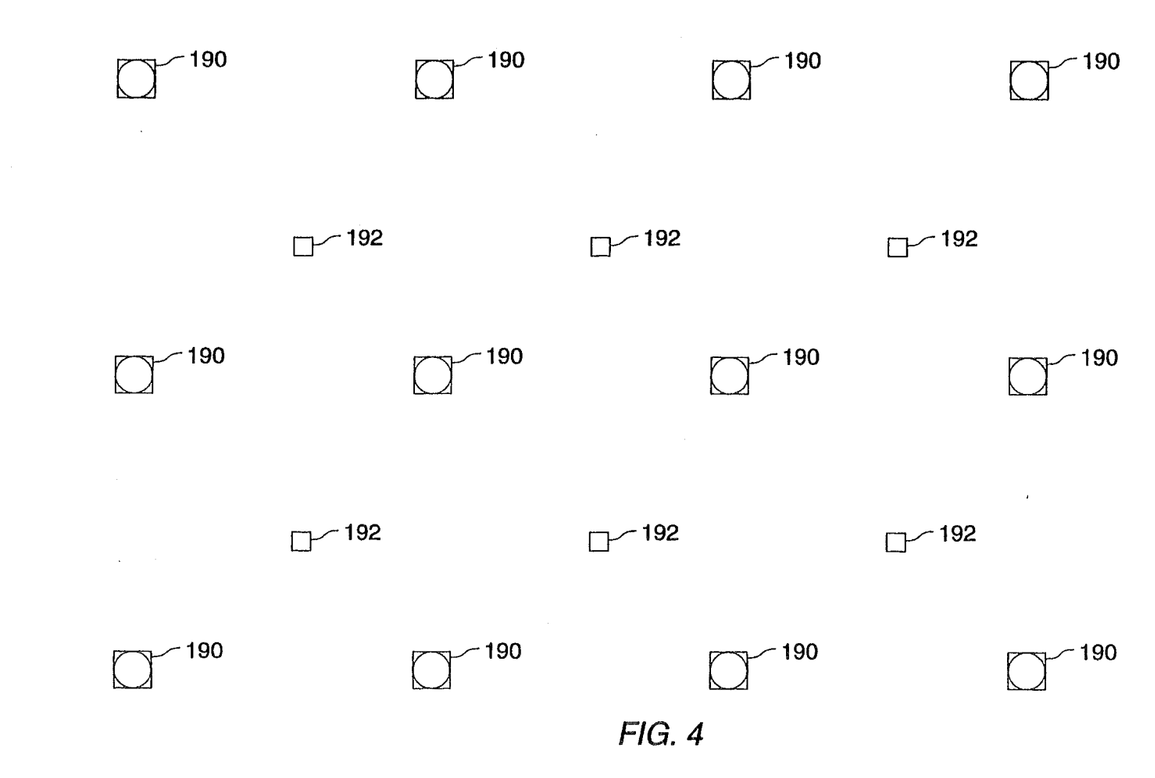
FIG. 4 is a typical layout pattern for I/O pads and programming pads in a pin-grid array which may be used in the embodiment of FIG. 3.

Because the programming pads 160 through 182 are used only for first stage programming and do not carry an appreciable amount of current, they may be made smaller than the I/O pads 32, 34, 36, 58, 60, 62, 64 and 66 and may be arranged using a closer pitch. For example, in a typical design, the I/O pads 32, 34, 36, 58, 60, 62, 64 and 66 are 144 mils$^2$ and the programming pads 160 through 182 may be 64 mils$^2$. If I/O pads 32, 34, 36, 58, 60, 62, 64 and 66 are placed on a die using a 20 mil spacing, the programming pads may be placed between them as shown in FIG. 4. Referring now to FIG. 4, I/O pads 190 and programming pads 192 are shown in a typical layout. Those of ordinary skill in the art will recognize the layout of FIG. 4 as a pin-grid layout.

The programmable interconnection 10 matrix of the embodiment of FIG. 3 may be programmed using the programming pads 160 through 182 o provide programming voltages to the interior conductors in place of pullup and pulldown the transistors of the embodiment of FIG. 2. Thus, for example, a circuit path from I/O pad 36 to I/O pad 64 may be created by programming programmable interconnect elements 90, 98, 100, 82, and 84. Programmable interconnect element 90 is programmed by applying a voltage having a potential of $V_{PP}$ between I/O pad 36 and programming pad 176. Programmable interconnect element 98 is programmed by applying a voltage having a potential of $V_{PP}$ between programming pads 170 and 176. Programmable interconnect element 100 is programmed by applying a voltage having a potential of $V_{PP}$ between programming pads 170 and 178. Programmable interconnect element 82 is programmed by applying a voltage having a potential of $V_{PP}$ between programming pads 162 and 178. Programmable interconnect element 84 is programmed by applying a voltage having a potential of $V_{PP}$ between I/O pad 64 and programming pad 162.

As in the embodiment of FIG. 2, programming speed may be increased by simultaneous programming of several segments. For example, in the example given above where it is desired to connect I/O pad 36 to I/O pad 64, $V_{PP}$ may be applied to I/O pad 36, and to programming pads 170 and 162, while ground is simultaneously applied to programming pads 176, 178 and I/O pad 64.

As in the embodiment of FIG. 1, the programming process according to the present invention is a two-step process. According to this aspect of the present invention, after all antifuses in a circuit path between two I/O pads have been programmed, a second programming phase includes passing a high programming current through the completed circuit between the two I/O pads. The programming current is of sufficient magnitude to lower the resistance of each of the antifuses in the circuit to an acceptable final low value. In the example just given, after antifuses 90, 98, 100, 82, and 84 have been initially programmed by rupturing the antifuse material, a ramped current is passed between I/O pads 36 and 64. The purpose of ramping the current is to prevent high voltages internally which might inadvertently program antifuses which have not yet been programmed and still exhibit a high impedance.

In the case of pin drivers, where small external pins replace pullup and pulldown transistors, the use of low current reduces the complexity and the cost of the pin driver circuitry.

Figure 5A:
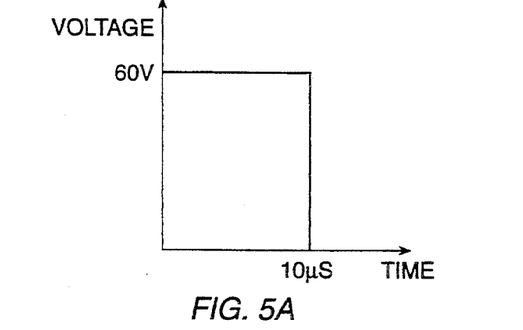
FIGS. 5a–5d are graphs which show typical waveforms used for programming of the interconnection matrix of either FIG. 2 or FIG. 3.
Figure 5B:
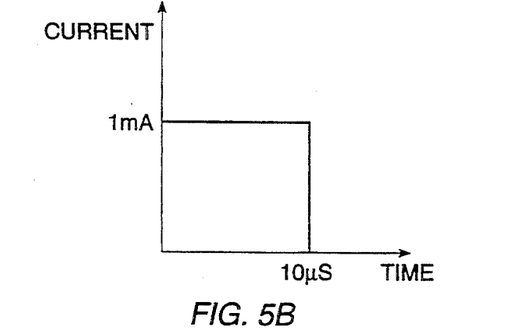
Figure 5C:
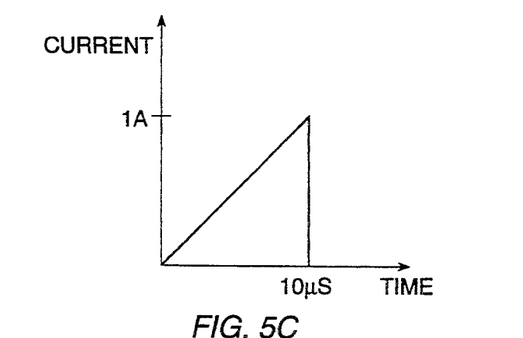
Figure 5D:
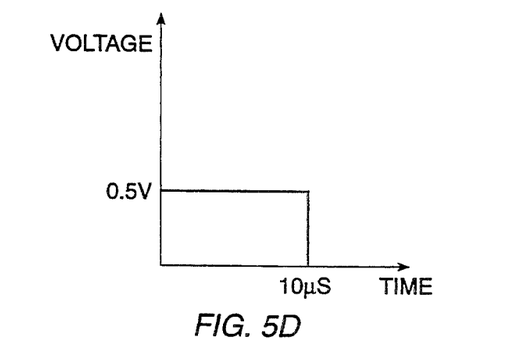

FIGS. 5a–5d show typical waveforms used for programming of the interconnection matrix. FIGS. 5a and 5b are voltage and current waveform examples of trigger pulses utilized to initially program antifuses. FIGS. 5c and 5d show examples of ramped high current, low voltage waveforms applied to user pins to complete the programming. Those of ordinary skill in the art will recognize that these waveforms are only exemplary and that other waveforms can also be used.

The present invention permits a large reduction in programming time because several devices are programmed together during the high-current portion of the programming cycle. This is especially advantageous when applied to an interconnection matrix having a large number of programmable interconnect elements.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A user-programmable interconnection matrix, including:
   a plurality of input/output pins;
   a plurality of first external and internal conductors disposed in a first direction, said external ones of said first conductors individually connected to first ones of said input/output pins;
   a plurality of second external and internal conductors disposed in a second direction different from said first direction and intersecting ones of said first conductors at intersections, external ones of said second conductors individually connected to second ones of said input/output pins;
   a plurality of programmable interconnect elements, said programmable interconnect elements characterized by programming at a selected programming voltage, ones of said programmable interconnect elements connected between ones of said first external and internal conductors and ones of said second external and internal conductors at said intersections;
   a programming voltage supplier selectively coupling internal ones of said first and said second conductors to voltage potentials such that said selected programming voltage is placed across selected ones of said programmable interconnect elements, said programming voltage supplier adapted to supply said selected programming voltage at a current less than the current required to reduce the resistance of said programmable interconnect elements to their final lowest value.

2. A user-programmable interconnection matrix, including:
   a plurality of input/output pins;
   a plurality of first external and internal conductors disposed in a first direction, external ones of said first conductors individually connected to first ones of said input/output pins;
   a plurality of second external and internal conductors disposed in a second direction different from said first direction and intersecting ones of said first conductors at intersections, external ones of said second conductors individually connected to second ones of said input/output pins;
   a plurality of programmable interconnect elements, said programmable interconnect elements characterized by programming at a selected programming voltage, ones of said programmable interconnect elements connected between ones of said first external and internal conductors and ones of said second external and internal conductors at said intersections;
   pullup transistors individually connected between selected ones of said internal ones of said first and second conductors and a first programming potential node;
   a decoding circuit selectively turning on ones of said pullup transistors.

3. The user-programmable interconnection matrix of claim 2, further including:
   pulldown transistors individually connected between selected ones of said internal ones of said first and second conductors and a second programming potential node;
   a decoding circuit; selectively turning on ones of said pulldown transistors.

4. A user-programmable interconnection matrix, including:
   a plurality of input/output pins;
   a plurality of first external and internal conductors disposed in a first direction, external ones of said first conductors individually connected to first ones of said input/output pins;
   a plurality of second external and internal conductors disposed in a second direction different from said first direction and intersecting ones of said first conductors at intersections, external ones of said second conductors individually connected to second ones of said input/output pins;
   a plurality of programmable interconnect elements, said programmable interconnect elements characterized by programming at a selected programming voltage, ones of said programmable interconnect elements connected between ones of said first external and internal conductors and ones of said second external and internal conductors at said intersections;
   pulldown transistors individually connected between selected ones of said internal ones of said first and second conductors and ground potential;
   a decoding circuit selectively turning on ones of said pulldown transistors.

5. A user-programmable interconnection matrix, including:
   a plurality of input/output pins;
   a plurality of first external and internal conductors disposed in a first direction, external ones of said first conductors individually connected to first ones of said input/output pins;
   a plurality of second external and internal conductors disposed in a second direction different from said first direction and intersecting ones of said first conductors at intersections, external ones of said second conductors individually connected to second ones of said input/output pins;
   a plurality of programmable interconnect elements, said programmable interconnect elements characterized by programming at a selected programming voltage, ones of said programmable interconnect elements connected between ones of said first external and internal conductors and ones of said second external and internal conductors at said intersections;
   pullup transistors individually connected between selected ones of said internal ones of said first conductors and a source of a first electrical potential;
   pulldown transistors individually connected between selected ones of said internal ones of said second conductors and a source of a second electrical potential, said first and said second electrical potentials differing by an amount sufficient to program said programmable interconnect elements;
   a decoding circuit; selectively turning on ones of said pullup transistors and ones of said pulldown transistors associated with intersecting ones of said first and second conductors wherein programmable interconnect elements to be programmed are located.

6. A user-programmable interconnection matrix, including:

a plurality of input/output pins;
a plurality of first external and internal conductors disposed in a first direction, external ones of said first conductors individually connected to first ones of said input/output pins and internal ones of said first conductors individually connected to first programming pins accessible from the outside of said interconnection matrix;
a plurality of second external and internal conductors disposed in a second direction different from said first direction and intersecting ones of said first conductors at intersections, external ones of said second conductors individually connected to second ones of said input/output pins and internal ones of said second conductors individually connected to second programming pins accessible from the outside of said interconnection matrix;
a plurality of programmable interconnect elements, said programmable interconnect elements characterized by programming at a selected programming voltage, ones of said programmable interconnect elements connected between ones of said first external anti internal conductors and ones of said second external and internal conductors at said intersections.

7. In a user-programmable interconnection matrix, including a plurality of input/output pins, a plurality of first external and internal conductors disposed in a first direction, said external ones of said first conductors individually connected to first ones of said input/output pins, a plurality of second external and internal conductors disposed in a second direction different from said first direction and intersecting ones of said first conductors at intersections, external ones of said second conductors individually connected to second ones of said input/output pins, a plurality of programmable interconnect elements, said programmable interconnect elements characterized by programming at a selected programming voltage and characterized by a decrease in resistance as current passes therethrough, ones of said programmable interconnect elements connected between ones of said first external and internal conductors and ones of said second external and internal conductors at said intersections, programming voltage supplier selectively coupling said internal ones of said first and said second conductors to first and second voltage potentials such that said selected programming voltage is placed across selected ones of said programmable interconnect elements, said programming voltage supplier adapted to supply said selected programming voltage at a current less than the current required to reduce the resistance of said programmable interconnect elements to their final lowest value, a method for programming a circuit path including selected ones of said first external and internal conductors and said second external and internal conductors between two selected ones of said input/output pins, including the steps of:
programming all programmable interconnect elements in said circuit path sufficiently to reduce the resistance of said programmable interconnect elements in said circuit path to an intermediate value; and
passing a current between said two selected ones of said input/output pins, said current having a magnitude sufficient to reduce the resistance of said programmable interconnect elements in said circuit path to a final value lower than said intermediate value.

8. The method of claim 7, wherein the step of programming all programmable interconnect elements in said circuit path sufficiently to reduce the resistance of said programmable interconnect elements in said circuit path to an intermediate value includes the steps of:
(1) identifying selected ones of said internal conductors to comprise said circuit path;
(2) selecting a pair of intersecting ones of said selected ones of said internal conductors and activating the programming voltage supplier associated with said pair such that a first one of said pair is placed at said first voltage potential and a second one of said pair is placed at said second potential so as to place said programming voltage across the programmable interconnect element located at the intersection of said pair;
(3) repeating step (2) until all programmable interconnect elements at intersections of said selected ones of said internal conductors in said circuit path have been programmed to reduce their resistance to said intermediate value;
(4) activating the programming voltage supplier associated with the ones of said internal conductors intersecting the external conductors in said circuit path to place them at one of said first and second potentials and placing the other one of said first and second potentials on the input/output pins connected to the external conductors in said circuit path.

9. The decoding circuit of claim 2 wherein said decoding circuit further comprises an n-bit binary to one line address decoder.

10. The decoding circuit of claim 3 wherein said decoding circuit further comprises an n-bit binary to one line address decoder.

11. The decoding circuit of claim 4 wherein said decoding circuit further comprises an n-bit binary to one line address decoder.

12. The decoding circuit of claim 5 wherein said decoding circuit further comprises an n-bit binary to one line address decoder.

13. The decoding circuit of claim 2 wherein said decoding circuit further comprises a serial shift register chain.

14. The decoding circuit of claim 3 wherein said decoding circuit further comprises a serial shift register chain.

15. The decoding circuit of claim 4 wherein said decoding circuit further comprises a serial shift register chain.

16. The decoding circuit of claim 5 wherein said decoding circuit further comprises a serial shift register chain.

17. The programming voltage supplier of claim 1 wherein said programming voltage supplier further comprises a multiplexer.

18. A user-programmable interconnection architecture, including:
a plurality of input/output pins;
a plurality of first external conductors and a plurality first internal conductors both disposed in a first direction, selected ones of said first external conductors individually connected to selected ones of said input/output pins;
a plurality of second external conductors and a plurality of second internal conductors both disposed in a second direction different from said first direction and intersecting selected ones of said first external conductors and selected ones of said first internal conductors at intersections, selected ones of said second external conductors individually connected to selected ones of said input/output pins;

a plurality of programmable interconnect elements, said programmable interconnect elements programmable at a selected programming voltage, selected ones of said programmable interconnect elements connected between (A) selected ones of said first external conductors and said first internal conductors and (B) selected ones of said second external conductors and said second internal conductors, at said intersections;

a programming voltage supplier coupling selected ones of said first internal conductors and selected ones of said second internal conductors to voltage potentials such that said selected programming voltage is placed across selected ones of said programmable interconnect elements, said programming voltage supplier adapted to supply said selected programming voltage at a current less than the current required to reduce the resistance of said programmable interconnect elements to their final lowest value.

19. A user-programmable interconnection architecture, including:

a plurality of input/output pins;

a plurality of first external conductors and a plurality first internal conductors both disposed in a first direction, selected ones of said first external conductors individually connected to selected ones of said input/output pins;

a plurality of second external conductors and a plurality of second internal conductors both disposed in a second direction different from said first direction and intersecting selected ones of said first external conductors and selected ones of said first internal conductors at intersections, selected ones of said second external conductors individually connected to selected ones of said input/output pins;

a plurality of programmable interconnect elements, said programmable interconnect elements programmable at a selected programming voltage, selected ones of said programmable interconnect elements connected between (A) selected ones of said first external conductors and said first internal conductors and (B) selected ones of said second external conductors and said second internal conductors, at said intersections;

pullup transistors individually connected between (A) selected ones of said first internal conductors and said second internal conductors and (B) a first programming potential node; and a decoding circuit switching selected ones of said pullup transistors.

20. The user-programmable interconnection architecture of claim 19, further including:

pulldown transistors individually connected between (A) selected ones of said first internal conductors and said second internal conductors and (B) a second programming potential node;

a decoding circuit switching selected ones of said pulldown transistors.

21. A user-programmable interconnection architecture, including:

a plurality of input/output pins;

a plurality of first external conductors and a plurality first internal conductors both disposed in a first direction, selected ones of said first external conductors individually connected to selected ones of said input/output pins;

a plurality of second external conductors and a plurality of second internal conductors both disposed in a second direction different from said first direction and intersecting selected ones of said first external conductors and selected ones of said first internal conductors at intersections, selected ones of said second external conductors individually connected to selected ones of said input/output pins;

a plurality of programmable interconnect elements, said programmable interconnect elements programmable at a selected programming voltage, selected ones of said programmable interconnect elements connected between (A) selected ones of said first external conductors and said first internal conductors and (B) selected ones of said second external conductors and said second internal conductors, at said intersections;

pulldown transistors individually connected between (A) selected ones of said first internal conductors and said second internal conductors and (B) ground potential;

a decoding circuit switching selected ones of said pulldown transistors.

22. A user-programmable interconnection architecture, including:

a plurality of input/output pins;

a plurality of first external conductors and a plurality first internal conductors both disposed in a first direction, selected ones of said first external conductors individually connected to selected ones of said input/output pins;

a plurality of second external conductors and a plurality of second internal conductors both disposed in a second direction different from said first direction and intersecting selected ones of said first external conductors and selected ones of said first internal conductors at intersections, selected ones of said second external conductors individually connected to selected ones of said input/output pins;

a plurality of programmable interconnect elements, said programmable interconnect elements programmable at a selected programming voltage, selected ones of said programmable interconnect elements connected between (A) selected ones of said first external conductors and said first internal conductors and (B) selected ones of said second external conductors and said second internal conductors, at said intersections;

pullup transistors individually connected between selected ones of said first internal conductors and a source of a first electrical potential;

pulldown transistors individually connected between selected ones of said second internal conductors and a source of a second electrical potential, said first and said second electrical potentials differing by said selected programming voltage;

a decoding circuit switching selected ones of said pullup transistors and selected ones of said pulldown transistors associated with intersecting (A) selected ones of said first external conductors and said first internal conductors and (B) selected ones of said second external conductors and said second internal conductors wherein programmable interconnect elements to be programmed are located.

23. A user-programmable interconnection architecture, including:

a plurality of input/output pins;

a plurality of first external conductors and a plurality of first internal conductors disposed in a first direction, selected ones of said first external conductors individually connected to selected ones of said input/output pins and selected ones of said first internal conductors individually connected to first programming pins accessible from the outside of said interconnection architecture;

a plurality of second external conductors and a plurality of second internal conductors disposed in a second direction different from said first direction and intersecting selected ones of said first external conductors and selected ones of said first internal conductors at intersections, selected ones of said second external conductors individually connected to selected ones of said input/output pins and selected ones of said second internal conductors individually connected to second programming pins accessible from the outside of said interconnection architecture;

a plurality of programmable interconnect elements, said programmable interconnect elements programmable at a selected programming voltage, selected ones of said programmable interconnect elements connected between (A) selected ones of said first external conductors and said first internal conductors and (B) selected ones of said second external conductors and said second internal conductors, at said intersections.

24. In a user-programmable interconnection architecture, including a plurality of input/output pins, a plurality of first external conductors and a plurality of first internal conductors disposed in a first direction, selected ones of said first external conductors individually connected to first ones of said input/output pins, a plurality of second external conductors and a plurality of second internal conductors disposed in a second direction different from said first direction and intersecting selected ones of said first external conductors and selected ones of said first internal conductors at intersections, selected ones of said second external conductors individually connected to second ones of said input/output pins, a plurality of programmable interconnect elements, said programmable interconnect elements programmable at a selected programming voltage and characterized by a decrease in resistance as current passes therethrough, selected ones of said programmable interconnect elements connected between (A) selected ones of said first external conductors and said first internal conductors and (B) selected ones of said second external conductors and said second internal conductors, at said intersections, programming voltage supplier coupling selected ones of said first internal conductors and said second internal conductors to first and second voltage potentials such that said selected programming voltage is placed across selected ones of said programmable interconnect elements, said programming voltage supplier adapted to supply said selected programming voltage at a current less than the current required to reduce the resistance of said programmable interconnect elements to their final lowest value, a method for programming a circuit path including (A) selected ones of said first external conductors and said first internal conductors and (B) selected ones of said second external conductors and said second internal conductors between two selected ones of said input/output pins, including the steps of:

programming all programmable interconnect elements in said circuit path sufficiently to reduce the resistance of said programmable interconnect elements in said circuit path to an intermediate value; and passing a current between said two selected ones of said input/output pins, said current having a magnitude sufficient to reduce the resistance of said programmable interconnect elements in said circuit path to a final value lower than said intermediate value.

25. The method of claim 24, wherein the step of programming all programmable interconnect elements in said circuit path sufficiently to reduce the resistance of said programmable interconnect elements in said circuit path to an intermediate value includes the steps of:

(1) identifying selected ones of said first internal conductors and selected ones of said second internal conductors to comprise said circuit path;

(2) selecting a pair of intersecting ones of selected ones of said first internal conductors and selected ones of said second internal conductors and activating the programming voltage supplier associated with said pair such that a first one of said pair is placed at said first voltage potential and a second one of said pair is placed at said second potential so as to place said programming voltage across the programmable interconnect element located at the intersection of said pair;

(3) repeating step (2) until all programmable interconnect elements at intersections of selected ones of said first internal conductors and selected ones of said second internal conductors in said circuit path have been programmed to reduce their resistance to said intermediate value;

(4) activating the programming voltage supplier associated with selected ones of said first internal conductors and selected ones of said second internal conductors intersecting said first external conductors and said second external conductors in said circuit path to place them at one of said first and second potentials and placing the other one of said first and second potentials on the input/output pins connected to the said first external conductors and said second external conductors in said circuit path.

26. The decoding circuit of claim 19 wherein said decoding circuit further comprises an n-bit binary to one line address decoder.

27. The decoding circuit of claim 20 wherein said decoding circuit further comprises an n-bit binary to one line address decoder.

28. The decoding circuit of claim 21 wherein said decoding circuit further comprises an n-bit binary to one line address decoder.

29. The decoding circuit of claim 22 wherein said decoding circuit further comprises an n-bit binary to one line address decoder.

30. The decoding circuit of claim 19 wherein said decoding circuit further comprises a serial shift register chain.

31. The decoding circuit of claim 20 wherein said decoding circuit further comprises a serial shift register chain.

32. The decoding circuit of claim 21 wherein said decoding circuit further comprises a serial shift register chain.

33. The decoding circuit of claim 22 wherein said decoding circuit further comprises a serial shift register chain.

34. The programming voltage supplier of claim 18 wherein said programming voltage supplier further comprises a multiplexer.

* * * * *